United States Patent [19]

Yang

[11] Patent Number: 5,401,682
[45] Date of Patent: Mar. 28, 1995

[54] METHOD OF FABRICATING HIGH VOLTAGE JUNCTION TERMINATION EXTENSION STRUCTURE FOR A SEMICONDUCTOR INTEGRATED CIRCUIT DEVICE

[75] Inventor: Sheng-Hsing Yang, Hsinchu, Taiwan, Prov. of China

[73] Assignee: United Microelectronics Corp., Hsinchu City, Taiwan, Prov. of China

[21] Appl. No.: 212,429

[22] Filed: Mar. 11, 1994

[51] Int. Cl.$^6$ .................................. H01L 21/302
[52] U.S. Cl. .................................. 437/61; 437/63; 437/228; 257/508
[58] Field of Search ............... 437/190, 187, 228, 235, 437/239, 245, 978, 985, 61, 63; 257/635, 637, 638, 640, 647, 324, 368, 396, 508, 499, 500; 148/DIG. 117

[56] References Cited

U.S. PATENT DOCUMENTS

| | | | |
|---|---|---|---|
| 4,646,426 | 3/1987 | Sasaki | 29/571 |
| 4,755,480 | 7/1988 | Yau et al. | 437/47 |
| 4,904,614 | 2/1990 | Fisher et al. | 437/41 |
| 5,286,985 | 2/1994 | Taddiken | 257/200 |
| 5,286,998 | 2/1994 | Ema | 257/637 |

*Primary Examiner*—George Fourson
*Assistant Examiner*—David Mason
*Attorney, Agent, or Firm*—Ladas & Parry

[57] ABSTRACT

A method for fabricating a junction terminal extension structure for a high-voltage integrated circuit device. The method provides for the formation of two silicon oxide layers having a two-stage shaped final field region oxide in the proximity of the anode of a high-voltage integrated circuit device. A field region anode flat plate can be formed in the area of the two-stage shaped structure. The distance between the edge of the field region flat plate and the surface of the silicon substrate thus be increased to compared to prior art structures, and the electric field intensity therebetween can therefore be reduced, resulting in the increased breakdown voltage to increase the reliability of the integrated circuit device.

13 Claims, 3 Drawing Sheets

METHOD OF FABRICATING HIGH VOLTAGE JUNCTION TERMINATION EXTENSION STRUCTURE FOR A SEMICONDUCTOR INTEGRATED CIRCUIT DEVICE

BACKGROUND OF THE INVENTION

Field of the Invention

The present invention relates in general to a method of manufacturing high-voltage semiconductor integrated circuit devices. More particularly, this invention relates to a method of manufacturing a junction termination extension (JTE) structure for high-voltage semiconductor integrated circuit devices and to the resulting structure itself.

Technical Background

High-voltage integrated circuit devices have been widely utilized in the fields of communications and electric machine control, as well as in power supplies and consumer electronics. More wide spread utilization of these devices is expected in other fields in the future.

One problem with the conventional high-voltage integrated circuit devices is the excessive electric field intensity produced in the region near the reverse-biased P-N junction area. Several measures had been employed in the past to coup with this problem. One of them is the so-called junction termination extension (JTE) technique described in "Increased Avalanche Breakdown Voltage and Controlled Surface Electric Fields Using a Junction Termination Extension (JTE) Technique" by V. A. K. Temple, *IEEE Transactions On Electron Devices*, Vol. ED-30, pp. 954–957, 1983, the disclosure of which is hereby incorporated herein by reference. This technique has been shown to be able to achieve effective blocking capability against the effects of the electric field, even though in a traverse direction the reverse-biased space-charge region is constrained.

Another related problem, however, should also be considered, namely, the excessive electric field intensity present in the region where the metal interconnection strides the space-charge region. The effect of the metal interconnection to the electric field is dependent on its distance to the silicon substrate beneath it. Typically, there is an oxide layer present between the metal interconnection and the substrate, with the oxide layer having a thickness of approximately 3–5 $\mu$m.

SUMMARY OF THE INVENTION

The object of the invention, therefore, is to provide a method of fabricating a junction terminal extension structure for a high-voltage integrated circuit device that solves the problem of low breakdown voltage noted above.

In general terms, the present invention provides a method of fabricating a junction terminal extension structure for a high-voltage integrated circuit device. A first protective layer is over a silicon substrate and patterned to expose a predetermined location on the silicon substrate. A first layer of silicon oxide is then formed at the predetermined location on the silicon substrate. A second protective layer is deposited over the silicon substrate and patterned to expose most of the silicon oxide, a portion of the silicon oxide proximate an anode of the high-voltage integrated circuit device also being covered with the second protective layer. A second field region oxide layer is then formed on said first layer where it is not protected by said second protective layer. Next, the first and second protective layers are removed and the first and second layers of silicon oxide define a two-staged field region oxide layer in the proximity of the anode of the high-voltage integrated circuit device. An anode metal layer is formed with a field region flat plate extending from the anode over the two-staged field region oxide layer. A third oxide layer is deposited over the substrate and patterned to define at least a cathode lead opening therein. Finally, a cathode metal layer is formed with a high-voltage metal interconnection extending from the cathode metal layer and over the first, second and third oxide layers to provide the junction terminal extension structure of the high-voltage integrated circuit.

In another aspect the present invention provides a junction terminal extension structure for a high-voltage integrated circuit device. The structure includes first and second layers of oxide disposed on a semiconductor substrate at a predetermined location thereon. The second layer has a dimension in a direction parallel to a major surface of the semiconductor substrate which is smaller than a corresponding dimension of the first layer to thereby define a stepped or a two-staged field region oxide layer, the stepped or two-staged field region oxide layer being proximate an anode of said high-voltage integrated circuit device. An anode metal layer has a field region flat plate which extends from said anode over the stepped or two-staged field region oxide layer. A third oxide layer is disposed over said substrate and has at least a cathode lead opening therein. A cathode metal layer passes through the cathode lead opening and a high-voltage metal interconnection extends from the cathode metal layer and over said first, second and third oxide layers to provide the junction terminal extension structure of said high-voltage integrated circuit.

BRIEF DESCRIPTION OF THE DRAWING

Other objects, features and advantages of the present invention will become apparent by the following detailed description of the preferred, but non-limiting embodiment, with reference to the accompanied drawings, wherein.

DETAILED DESCRIPTION

Figure 1:
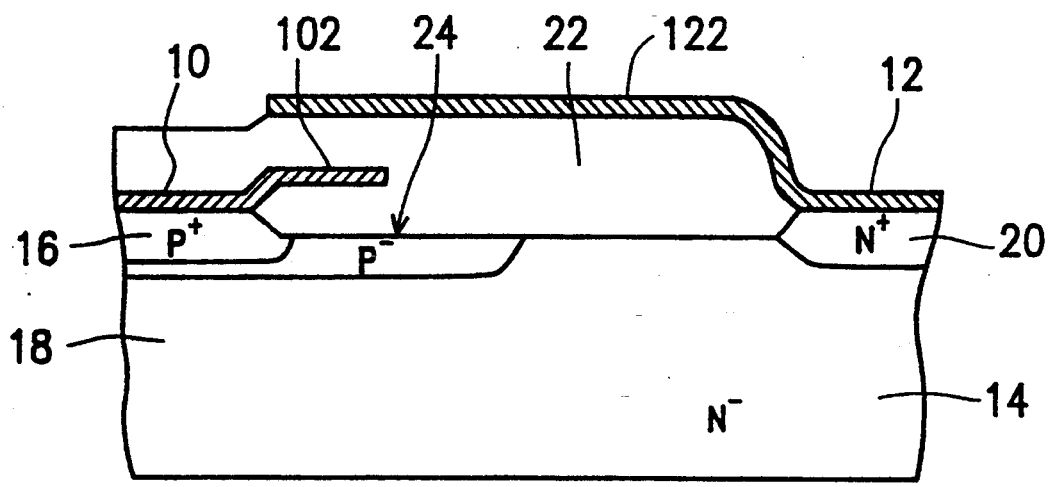
FIG. 1 is a diagram showing a cross section of the structure of a prior art junction terminal extension diode having high voltage metal interconnection.

Referring first to FIG. 1, a prior art junction terminal extension (JTE) structure, in the form of a diode having high-voltage metal interconnection, is shown for the purpose of comparison to and to better understand the present invention.

In the prior art JTE structure of FIG. 1, an anode 10 has a stage-shaped field region flat plate or field plate 102. The typical length of the field plate 102 is approximately 10 $\mu$m, and the distance between the field plate 102 and the silicon substrate 14 is approximately 1 $\mu$m. A P+ region 16 is in contact with the anode 10. Adjacent the P+ region 16 is a lightly doped P− layer 18. Cathode 12 has a high-voltage metal interconnection 122 which extends parallel to the silicon substrate 14 and spaced a distance of approximately 3–5 $\mu$m. An N+ region 20 is in contact with the cathode 12. Field plate 102 and the metal interconnection 122 are separated from the surface of the silicon substrate 14 by a silicon dioxide layer 22.

Due to the fact that the metal interconnection 122 carries a high voltage which is disposed above the field plate 102, a high intensity electric field occurs at the surface of the silicon substrate 14 in a region below the edge of the field plate 102, which region is indicated by arrow 24. The breakdown voltage of the device is severely degraded as a result of the presence of this high intensity electric field, especially in the case when the thickness of the oxide layer below the field plate 102 and the thickness of the oxide layer below the metal interconnection 122 are both small. Obviously, the smaller the thickness, the greater the degradation of the avalanche breakdown voltage. More detailed descriptions of this phenomena can be found in the paper "Influence of Interconnections onto the Breakdown Voltage of Planar High-Voltage P-N Junctions" by E. Falck et al., *IEEE Transactions on Electron Devices*, Vol. 40, No. 2, pp. 439–447, 1993, the disclosure of which is hereby incorporated by reference.

A preferred embodiment of the present invention will now be described. A junction terminal extension structure for high-voltage integrated circuit devices in accordance with the present invention can be fabricated by a process which will be described sequentially with reference to FIGS. 2a–2g.

Figure 2A:
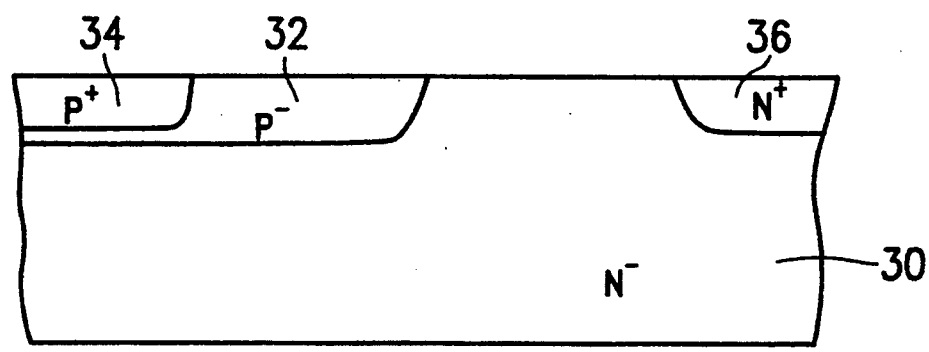
FIGS. 2a–2g shows a junction terminal extension structure in accordance with a preferred embodiment of the present invention in the stages of the process steps of fabrication.

As shown in FIG. 2a, an N− type silicon substrate 30 is provided which has a thin oxide layer (not shown). A photoresist layer is applied on the substrate and patterned, using conventional photolithographic techniques, leaving an area to be implanted, to form the P− layer 32, exposed. After implanting layer 32, the aforementioned photoresist is removed. A similar process is used to implant a P+ region 34, i.e., a photoresist layer is applied on the substrate and patterned leaving exposed the area to be implanted. After implanting layer 34, the photoresist layer is then removed. The same sequence of process steps is repeated a third time to form an N+ region 36, i.e., by applying a photoresist layer on the substrate, patterning it, and exposing the desired N+ region to implantation and then removing the photoresist. After the third photoresist layer is removed, a conventionally used thin layer of oxide is also removed to provide a structure as is shown in FIG. 2a.

Figure 2B:
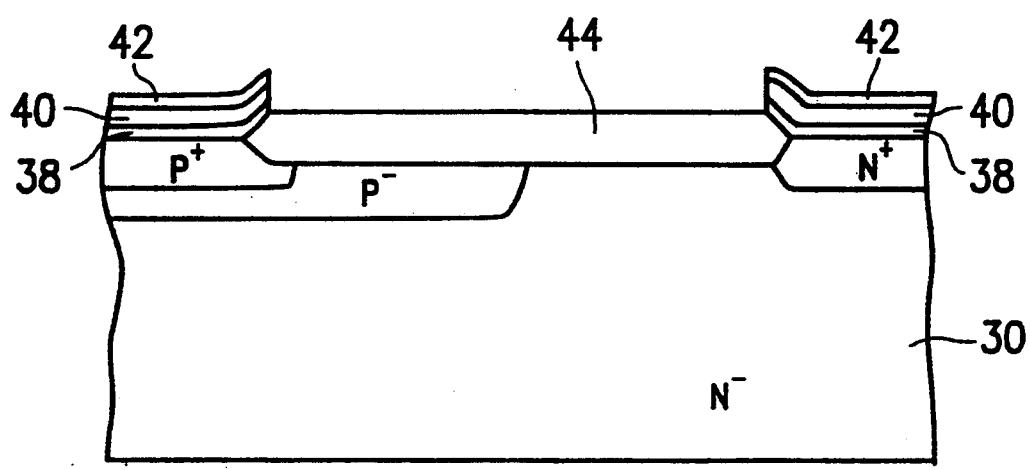

The process continues as will now be described with reference to FIG. 2b. An oxide layer 38 is first formed on the silicon substrate 30. A layer of nitride 40 is then deposited on the oxide layer. Then, a layer of photoresist (not shown) is patterned on the nitride layer, leaving an area, which will ultimately become a first field region oxide layer 44, exposed and the oxide layer and the nitride layer are etched away in that area. The photoresist is removed and then the first field region oxide layer 44 is formed by oxidation. At the same time, residual nitride will be converted to a thin oxide layer 42.

Figure 2C:
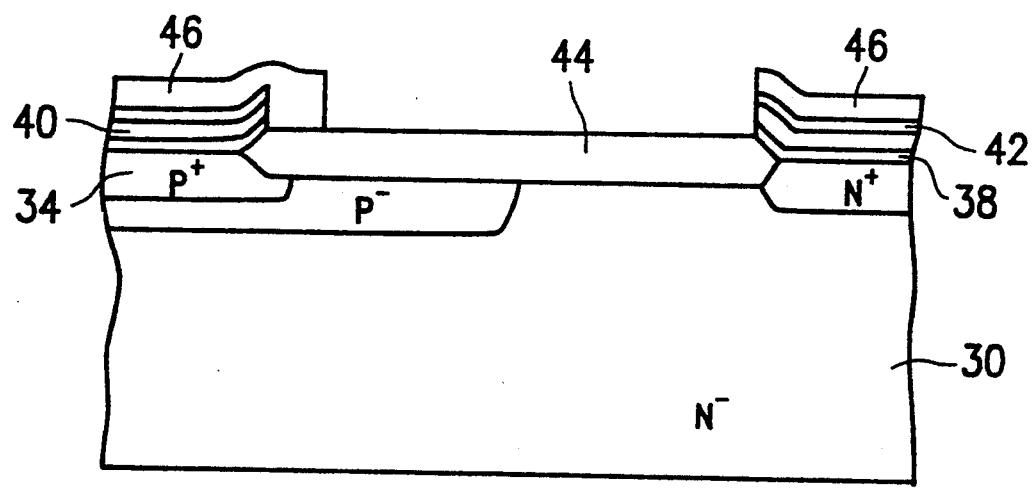

Turning now to FIG. 2c, another layer of silicon nitride 46 is deposited. A layer of photoresist not shown is applied and patterned so that it covers the original residual nitride layer 40 and oxide layer 42 and a portion of the field region oxide layer 44 in proximity to the P+ region 34, i.e., at the anode end. The exposed nitride is then etched away, and the photoresist layer is removed, leaving the structure shown in FIG. 2c.

Figure 2D:
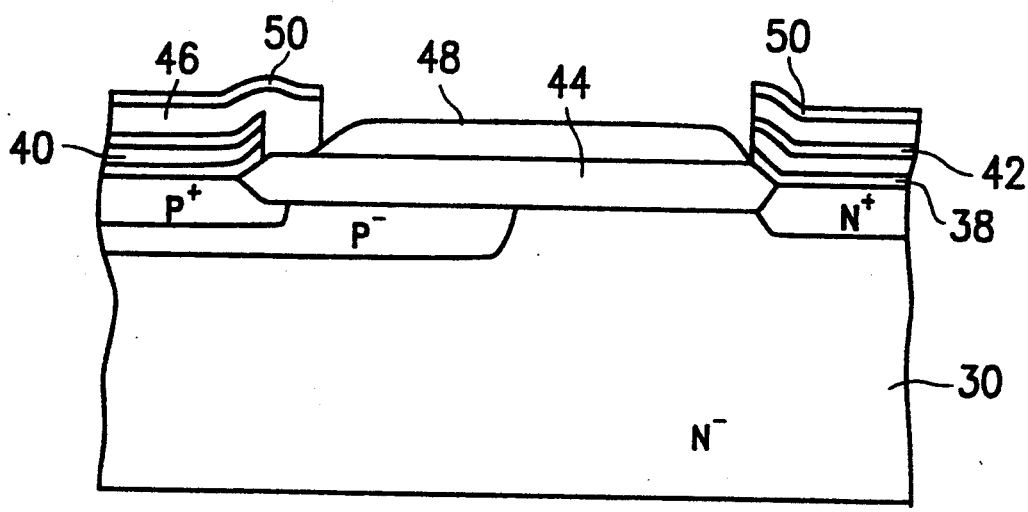

As shown in FIG. 2d, the exposed portion of field region 44 is then oxidized to form a second layer of oxide 48 in field region oxide as shown. At the same time a thin layer of oxide 50 will form on the exposed nitride 46.

Figure 2E:
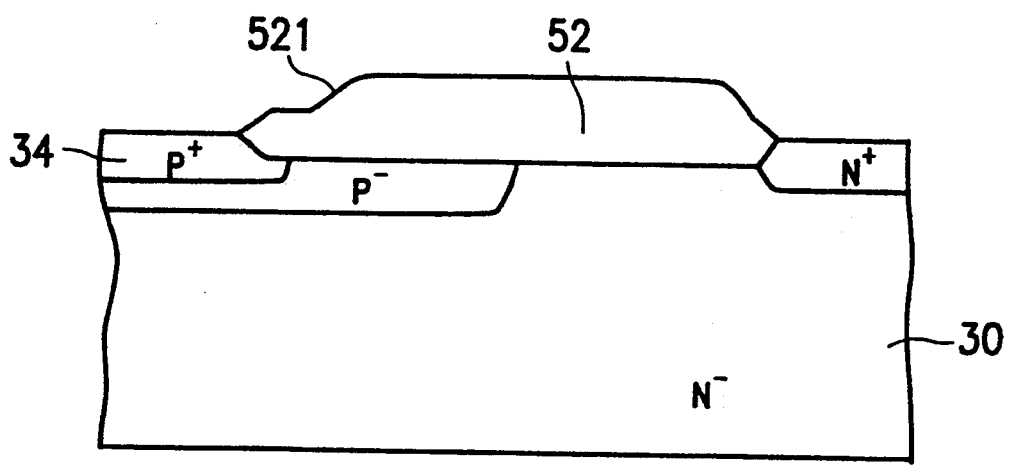

The residual oxide layer 50, nitride layer 46, oxide layer 42, silicon nitride layer 40, as well as the underlying oxide layer 38 are all etched away. While the aforementioned layers are being etched away, the second field region oxide layer 48 will also be subjected to some etching, and thus its thickness is slightly reduced, as indicated in FIG. 2e, wherein a thinner second field region oxide layer and the first field region oxide layer together constitute a field region oxide layer 52 having a two-staged shape or structure 521 at the left side thereof in this figure.

Figure 2F:
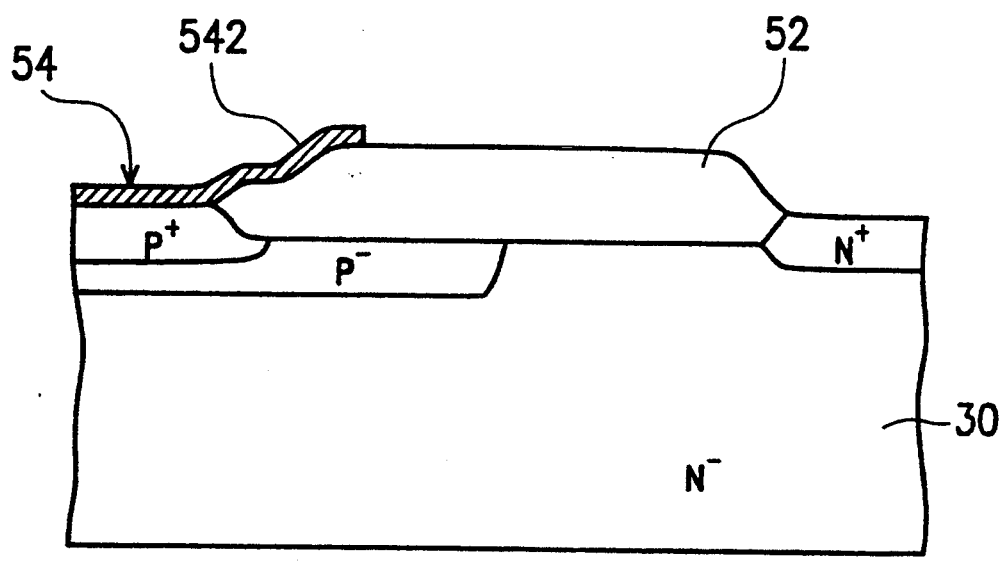
Figure 2G:
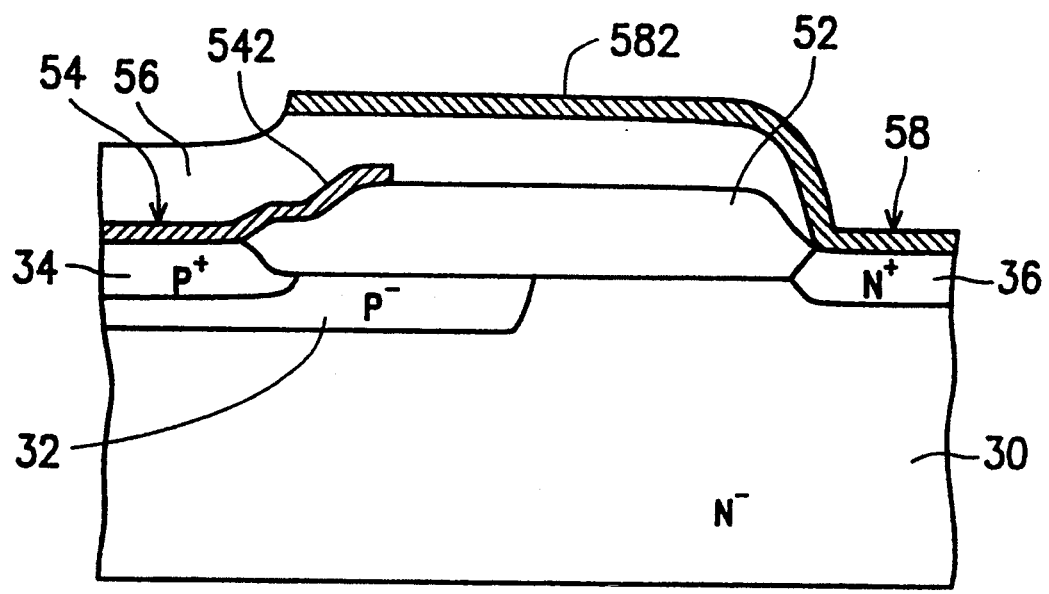

Turning now to FIG. 2f, a first layer of metal is deposited, preferably by sputtering, on the device and then it is patterned using conventional photoresist, masking, and etching procedures to form the anode 54 as well as its field region flat plate 542. After the flat plate 542 is formed, the remaining photoresist is removed. Then, as shown in FIG. 2g, a third oxide layer 56 is deposited, preferably by chemical vapor deposition. The oxide layer is patterned using conventional photoresist, masking and etching procedures to form a metal lead opening through the oxide so that the cathode 58, when formed, makes contact with the N+ region 36. A second metal layer is deposited, again preferably by sputtering, on the device and patterned using conventional photoresist, masking and etching procedures to form the cathode 58 as well as the metal interconnection 582, to obtain the junction terminal extension structure for a high-voltage integrated circuit device as shown in FIG. 2g.

In accordance with the present invention, after the formation of the field region oxide layer 44, another field region oxide layer 48 (FIG. 2d) is formed covering most, but not all, of the first mentioned oxide layer 44, to form the two-staged structure 521 at one end thereof. An anode flat plate 542 is formed which straddles over the two-staged structure (FIG. 2f). The distance between the edge of the field region flat plate 542 and the surface of the silicon substrate 30 can be increased as desired. This can result in a reduction of the electric field intensity therebetween and the breakdown voltage can therefore be raised to increase the reliability of the high-voltage integrated circuit device. The terms first, second and third have been used to refer to the oxide layers 44, 48 and 56 as a matter of convenience and due to the fact that they are important in forming the resulting device. Those skilled in the art will appreciate, of course, that other oxide layers may occur during the manufacturing process, before, after and between the formation of the first, second and third oxide layers Having described the invention in terms of a preferred embodiment thereof, modification will now suggest itself to those skilled in the art. Thus, the invention, as presented in the appended claims, is not to be limited to the disclosed embodiment, but rather includes such modification within its true scope and spirit.

I claim:

1. A method of fabricating a junction terminal extension structure for a high-voltage integrated circuit device having an anode and a cathode comprising the steps of:

forming a first protective layer over a silicon substrate and patterning the first protective layer to expose a location on the silicon substrate between the anode and the cathode:

forming a first layer of silicon oxide at said location on the silicon substrate;

forming a second protective layer over the silicon substrate and patterning the second protective layer to expose most of the silicon oxide, wherein a portion of the silicon oxide proximate the anode of the high-voltage integrated circuit device is also covered with said second protective layer;

forming a second field oxide layer on said first layer where not protected by said second protective layer;

removing the first and second protective layers, said first and second layers of silicon oxide defining a stepped field oxide layer in the proximity of the anode of said high-voltage integrated circuit device;

forming an anode metal layer at said anode, and forming a field region plate extending from said anode metal layer over the stepped field oxide layer;

forming a third oxide layer over said substrate and patterning to define at least a cathode lead opening therein; and forming a cathode metal layer at said cathode and a high-voltage metal interconnection extending from said cathode metal layer and over said first, second and third oxide layers to provide said junction terminal extension structure of said high-voltage integrated circuit.

2. The method according to claim 1 wherein said cathode high-voltage metal interconnection extends above said anode field region plate.

3. The method according to claim 1 wherein, prior to the step of forming said first oxide layer, said method further includes the steps of:

forming a first conductivity type region in said silicon substrate said region of the first conductivity type contacting said cathode metal layer when the latter is formed; and forming in said silicon substrate two regions of a second conductivity type, one of said a regions having a relatively higher concentration and the other having a relatively lower concentration, the region of higher concentration contacting said anode metal layer when the latter is formed, and also contacting said region of lower concentration.

4. The method according to claim 3 wherein said first conductivity type is N-type conductivity, and said second conductivity type is P-type conductivity.

5. The method according to claim 3 wherein said protective layers comprise silicon nitride.

6. The method according to claim 5 wherein said first and second oxide layers are formed by oxidation.

7. The method according to claim 6 wherein said third oxide layer is formed by deposition.

8. A method of fabricating a high-voltage integrated circuit device on a silicon substrate, said device having an anode end and a cathode end, said method comprising the steps of:

forming a first layer of silicon oxide between impurity regions in the substrate;

forming a second layer of silicon oxide covering a first portion of said first oxide layer such a second portion of the first layer proximate the anode end is not covered by the second oxide layer to thereby define a stepped oxide structure;

forming at said anode end a conductive anode layer having an anode field region plate extending from said conductive anode layer over the stepped oxide structure;

forming a third oxide layer over said substrate with at least a cathode lead opening therein; and forming at the cathode end a conductive cathode layer in said cathode lead opening and forming a conductive plate extending from said conductive cathode layer over said first, second and third oxide layers.

9. The method according to claim 8 wherein said cathode conductive plate extends above said anode field region plate.

10. The method according to claim 8 wherein the impurity regions in said substrate are formed by the following steps:

forming a first conductivity type region in said silicon substrate, said first conductivity type region contacting said cathode metal layer when the latter is formed; and forming in said silicon substrate two regions of a second conductivity type, one of said two regions having a relatively higher concentration and the other having a relatively lower concentration, the region of higher concentration contacting said anode metal layer when the latter is formed and also contacting said region of lower concentration.

11. The method according to claim 8 wherein said first conductivity type is N-type conductivity, and said second conductivity type is P-type conductivity.

12. The method according to claim 9 wherein said first and second oxide layers are formed by oxidation.

13. The method according to claim 12 wherein said third oxide layer is formed by deposition.

* * * * *